(12) United States Patent  
Fuergut et al.

(10) Patent No.: US 9,395,404 B2  
(45) Date of Patent: Jul. 19, 2016

(54) METHOD FOR TESTING SEMICONDUCTOR CHIPS OR SEMICONDUCTOR CHIP MODULES

(71) Applicant: Infineon Technologies AG, Neubiberg (DE)

(72) Inventors: Edward Fuergut, Dasing (DE); Horst Groeninger, Maxhuette-Haidhof (DE)

(73) Assignee: Infineon Technologies AG, Neubiberg (DE)

( * ) Notice: Subject to any disclaimer, the term of this patent is extended or adjusted under 35 U.S.C. 154(b) by 346 days.

(21) Appl. No.: 13/715,990

(22) Filed: Dec. 14, 2012

(65) Prior Publication Data

US 2014/0167800 A1 Jun. 19, 2014

(51) Int. Cl.
*G01R 31/20* (2006.01)
*G01R 31/26* (2014.01)

(52) U.S. Cl.
CPC .................................. *G01R 31/2601* (2013.01)

(58) Field of Classification Search
CPC .. G01R 31/2889; G01R 1/0491; G01R 31/26; G01R 31/2642; G01R 1/073; G01R 31/2601
USPC ............. 324/762.01–762.05, 754.01–754.03; 438/106; 257/774
See application file for complete search history.

(56) References Cited

U.S. PATENT DOCUMENTS

| | | | |
|---|---|---|---|
| 5,247,246 A | 9/1993 | Van Loan et al. | |
| 5,493,236 A * | 2/1996 | Ishii et al. | 324/750.22 |
| 5,990,692 A | 11/1999 | Jeong et al. | |
| 6,214,184 B1 * | 4/2001 | Chien et al. | 204/298.15 |
| 6,275,059 B1 * | 8/2001 | Sah et al. | 324/762.05 |
| 7,084,650 B2 * | 8/2006 | Cooper et al. | 324/750.25 |
| 7,482,822 B2 | 1/2009 | Cooper et al. | |
| 8,003,445 B2 | 8/2011 | Pagaila et al. | |
| 2004/0155240 A1 * | 8/2004 | Howland et al. | 257/48 |
| 2005/0057873 A1 * | 3/2005 | Kitagawa | 361/91.1 |
| 2005/0095728 A1 * | 5/2005 | Hillard | 438/14 |
| 2005/0104209 A1 * | 5/2005 | Kang | 257/737 |
| 2005/0207088 A1 * | 9/2005 | Nishimoto et al. | 361/234 |
| 2007/0296423 A1 * | 12/2007 | Whitener et al. | 324/754 |
| 2008/0100321 A1 * | 5/2008 | Nayak et al. | 324/758 |
| 2009/0146220 A1 * | 6/2009 | Yoo et al. | 257/392 |
| 2010/0019397 A1 * | 1/2010 | Youn et al. | 257/784 |
| 2010/0084756 A1 * | 4/2010 | Dirks | H01L 23/3114 257/690 |
| 2010/0244232 A1 * | 9/2010 | Pagaila | H01L 21/561 257/693 |
| 2011/0042809 A1 * | 2/2011 | Yang et al. | 257/738 |
| 2011/0074025 A1 * | 3/2011 | Yanase et al. | 257/737 |
| 2011/0204500 A1 * | 8/2011 | Lim et al. | 257/675 |
| 2011/0291252 A1 * | 12/2011 | Hosseini | 257/676 |
| 2011/0294260 A1 * | 12/2011 | Hwang et al. | 438/108 |
| 2011/0317491 A1 * | 12/2011 | Aritome | 365/185.24 |
| 2012/0028433 A1 * | 2/2012 | Naito | H01G 9/012 438/381 |
| 2012/0074549 A1 * | 3/2012 | Yow | H01L 23/3107 257/676 |
| 2012/0299610 A1 * | 11/2012 | Bieck | 324/754.03 |

FOREIGN PATENT DOCUMENTS

CN 1165401 A 11/1997
EP 2437076 A2 4/2012

* cited by examiner

*Primary Examiner* — Minh N Tang
(74) *Attorney, Agent, or Firm* — Slater Matsil, LLP (57) ABSTRACT

A semiconductor chip panel includes a plurality of semiconductor chips embedded in an encapsulation material. At least part of the semiconductor chips comprise a first electrical contact element on a first main face and a second electrical contact element on a second main opposite to the first main face, respectively. One of the plurality of semiconductor chips is tested by establishing an electrical contact between a test contact device and the first electrical contact element and between an electrically conductive holder and the second contact element.

12 Claims, 6 Drawing Sheets

METHOD FOR TESTING SEMICONDUCTOR CHIPS OR SEMICONDUCTOR CHIP MODULES

TECHNICAL FIELD

The present invention relates to a method for testing semiconductor chips or semiconductor chip modules, an apparatus for testing semiconductor chips, and an electrically conducting holder.

BACKGROUND

In power electronics very often semiconductor chips with vertical transistors like, for example, IGBT transistors are used or, in general, transistors in which at least one electrical contact pad is arranged on a first main face of the semiconductor chip and at least one other electrical contact pad is arranged on a second main face opposite to the first main face. Several ones of these semiconductor chips can be mounted on ceramic substrates or printed circuit boards and electrically connected to form power modules or power systems. In this way, for example, up to 20 power semiconductor chips can be combined and electrically connected with each other to form an electrical circuit.

One example of such modules are the so-called intelligent power modules (IPMs). Before delivering the semiconductor chip modules or the individual semiconductor chips to a customer it is important to know whether the semiconductor chip modules or the individual semiconductor chips are in good order and whether they fulfill predetermined performance criteria. Therefore, a need exists for a practical and efficient method for testing semiconductor chips and/or semiconductor chip modules, in particular those including semiconductor power transistor chips or semiconductor chips including vertical transistor structures.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A and 3B, collectively FIG. 3, show a top view (3A) and a cross-sectional side view (3B) of an electrically conducting substrate according to an embodiment;

FIGS. 5A through 5C, collectively FIG. 5, show a partial cross-sectional view (5A), an enlarged partial cross-sectional view (5B), and a top view (5C) of a test contact device, a semiconductor chip panel and an electrically conducting substrate before establishing an electrical contact;

FIGS. 6A and 6B, collectively FIG. 6, show a partial cross-sectional view (6A), and an enlarged partial cross-sectional view (6B) of the test contact device, the semiconductor chip panel and the electrically conducting substrate after establishing an electrical contact;

DETAILED DESCRIPTION OF ILLUSTRATIVE EMBODIMENTS

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method for testing semiconductor chips and an apparatus for testing semiconductor chips may use various types of semiconductor chips or semiconductor chip modules or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistors or other structures or devices in which at least one electrical contact pad is arranged on a first main face of the semiconductor chip and at least one other electrical contact pad is arranged on a second main face of the semiconductor chip opposite to the first main face of the semiconductor chip.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor chip. The contact elements or contact pads may be made from any electrically conducting material, e.g., from a metal as aluminum, gold, or copper, for example, or a metal alloy, or an electrically conducting organic material, or an electrically conducting semiconductor material. The contact elements may also be formed as layer stacks of one or more of the above-mentioned materials.

A semiconductor chip panel may comprise an encapsulant or encapsulating material having the semiconductor chips or semiconductor chip modules embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO, AlN, or BrN, for example. The semiconductor chip panel can have the form of a wafer, i.e., a circular form, but is not limited to the form and shape of a wafer but can have any size and shape and any suitable arrangement of semiconductor chips or semiconductor chip modules embedded therein.

In the claims and in the following description different embodiments of a method for testing semiconductor chips are described as a particular sequence of processes or measures, in particular in the flow diagram. It is to be noted that the embodiments should not be limited to the particular sequence described. Particular ones or all of different processes or measures can also be conducted simultaneously or in any other useful and appropriate sequence.

A method for testing semiconductor chips or semiconductor chip modules according to a first aspect may comprise providing a semiconductor chip panel comprising a plurality of semiconductor chips or semiconductor chip modules embedded in an encapsulation material, wherein at least part of the semiconductor chips comprise a first electrical contact element on a first main face and a second electrical contact element on a second main opposite to the first main face, respectively, and testing one of the plurality of semiconductor chips by establishing an electrical contact between a test contact device and the first electrical contact element and between an electrically conductive holder and the second contact element.

The semiconductor chip panel may include one or more of individual semiconductor chips or semiconductor chip modules. The semiconductor chip modules may include two or more semiconductor chips, in particular power transistor chips, and they may include at least one further semiconductor chip which may include one or more of a logic circuit or a driver circuit. In particular, the semiconductor chip modules may comprise the so-called intelligent power modules (IPMs).

Figure 1:
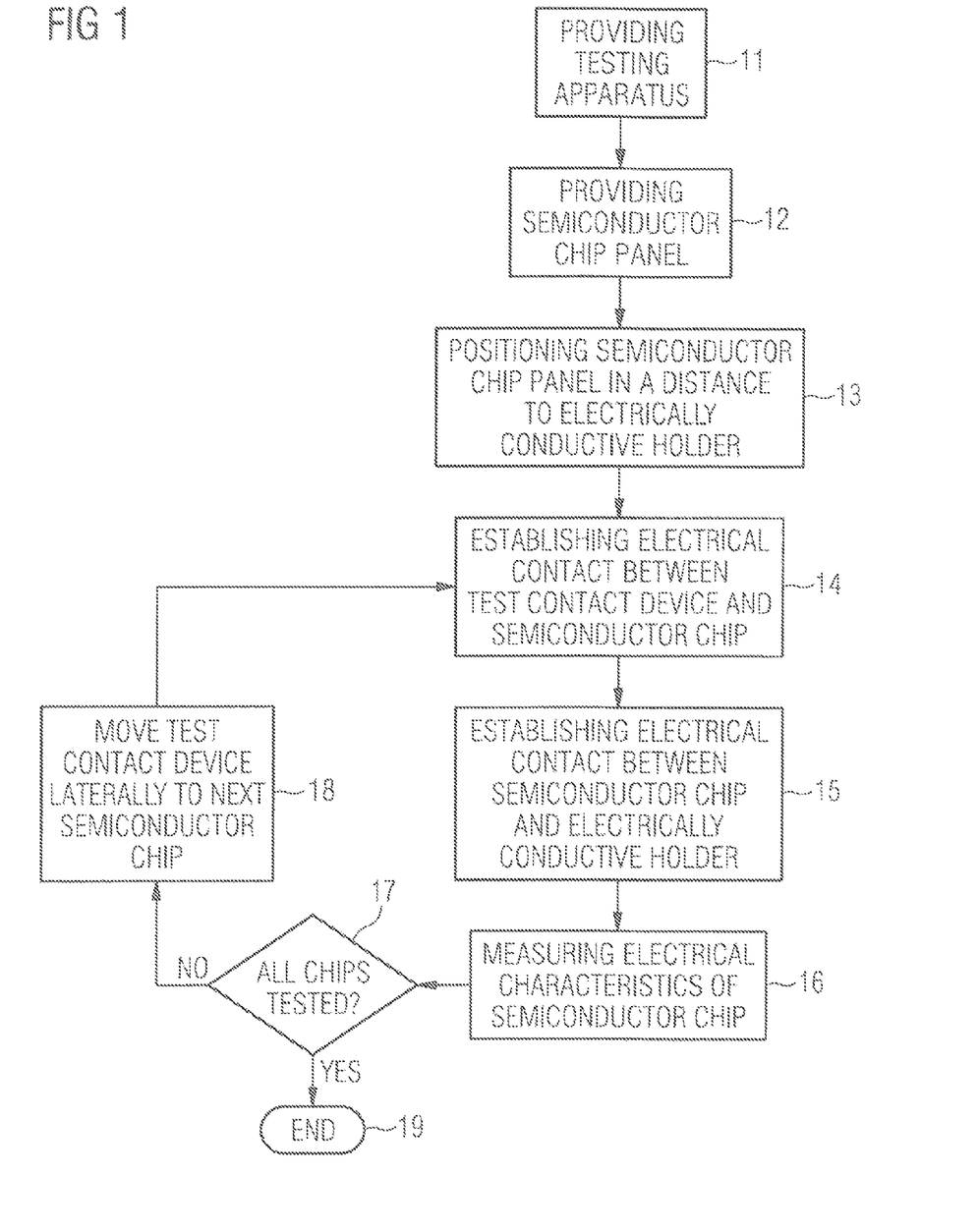
FIG. 1 shows a flow diagram for illustrating a method for testing semiconductor chips according to an embodiment.

FIG. 1 shows a flow diagram for illustrating a method for testing semiconductor chips or semiconductor chip modules according to an embodiment. The method 10 comprises providing a testing apparatus (prober) comprising a test contact device and an electrically conductive holder (chuck) (box 11).

Embodiments of the testing apparatus, in particular of the test contact device and the chuck will be shown below.

The method 10 further comprises providing a semiconductor chip panel comprising a plurality of semiconductor chips or semiconductor chip modules embedded in an encapsulation material (box 12). Each one of the semiconductor chips comprises an electrical device, a first main face and a second main face opposite to the first main face, the first main face having a first contact element and the second main face having a second contact element. In a previous step the semiconductor chips may have been fabricated on a semiconductor wafer, diced out of the semiconductor wafer and then embedded within the encapsulation material, either in the form of individual semiconductor chips or in the form of semiconductor chip modules. Embodiments of the semiconductor chip panel will be shown below.

The method 10 further comprises positioning the semiconductor chip panel in a distance to the electrically conductive holder so that the test contact device is positioned above a particular semiconductor chip or module to be tested (box 13). The semiconductor chip panel the test contact device have to be moved relative to each other laterally. So either the test contact device is moved laterally while fixing the semiconductor chip panel or the semiconductor chip panel is moved laterally while fixing the test contact device. This will be shown in greater detail below.

The method 10 further comprises establishing an electrical contact between the test contact device and a first contact element of one semiconductor chip of the plurality of semiconductor chips (box 14). This can be accomplished, for example, by moving the test contact device downwards in the direction of the semiconductor chip to be tested until test pins of the test contact device come into contact with the first contact element on the first main face of the semiconductor chip and maybe further test pins of the test contact device come into contact with a further contact element on the first main face of the semiconductor chip.

The method 10 further comprises establishing an electrical contact between a second contact element of the semiconductor chip and the chuck (box 15). This can be accomplished by, for example, exerting a downward force on the test contact device and thereby pressing the semiconductor chip downwards onto the chuck. It is also possible to first establish an electrical contact between the second contact element and the chuck by sucking the semiconductor chip panel onto the chuck and thereafter establish an electrical contact between the test contact device and the first contact element by moving the test contact device downwards until the electrical contact is established.

The method 10 further comprises testing the semiconductor chip or the semiconductor chip module by measuring one or more of the functionality, the performance and the electrical characteristics of the electrical device of the semiconductor chip or the semiconductor chip module (box 16).

According to an embodiment of the method 10, the flow diagram may be continued with block 17 in which an inquiry is made whether all semiconductor chips or modules of the plurality have been tested. If the answer is "YES," the flow diagram ends in block 19. If the answer is "NO," the flow diagram moves to block 18 according to which one of the test contact device or the semiconductor chip panel is moved laterally so that the test contact device is situated above the next semiconductor chip or module. Thereafter, the flow diagram moves again to block 14 for repeating the steps of blocks 14-16 with the new semiconductor chip or module.

Figure 2:
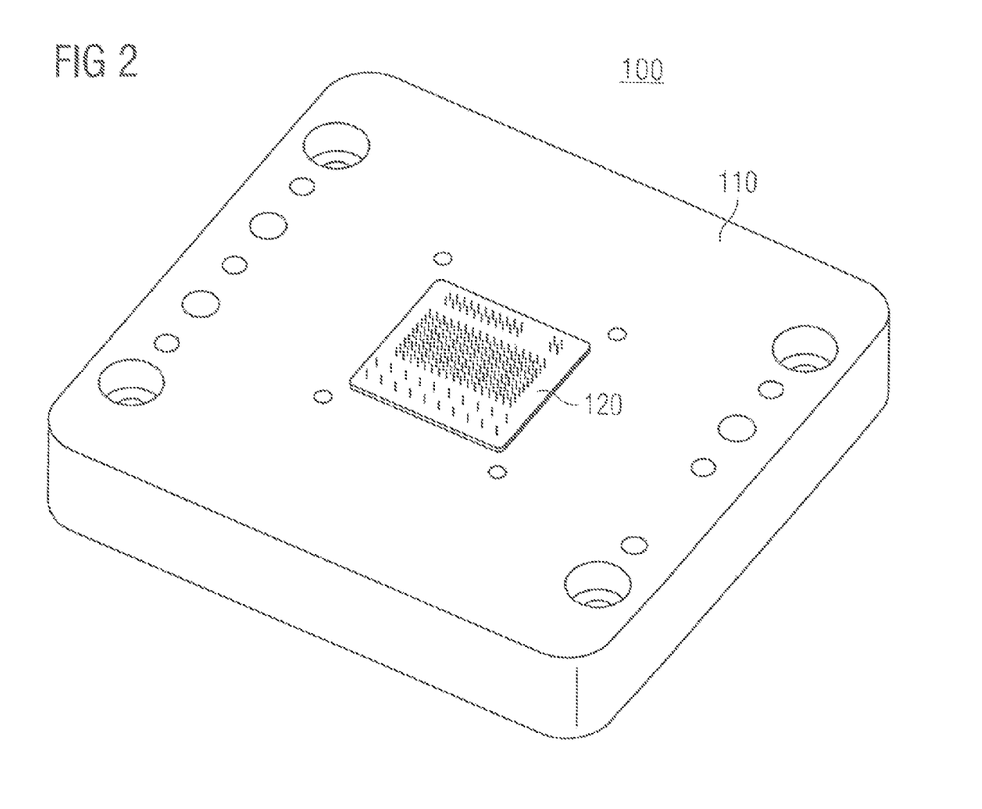
FIG. 2 shows a perspective view of a test contact device according to an embodiment.

According to an embodiment of the method 10, a test contact device can be provided which comprises a plurality of test contact pins. In FIG. 2 an example of such a test contact device is shown in a perspective view. The test contact device 100 of FIG. 2 comprises a metallic base plate 110 for holding a plurality of pins 120 in a center part of the base plate 110. The plurality of pins 120 may comprise electrical contact pins as well as distance pins. The electrical contact pins may be divided into different fields corresponding to electrical contact areas or pads of semiconductor chips to be tested. Distance pins may be configured as fixedly attached to and stationary with respect to the base plate 110 and the test contact pins 120 may be configured as slidably mounted within the base plate 110, in particular in the form of spring-loaded pins as will be shown in greater detail below.

Figure 3A:
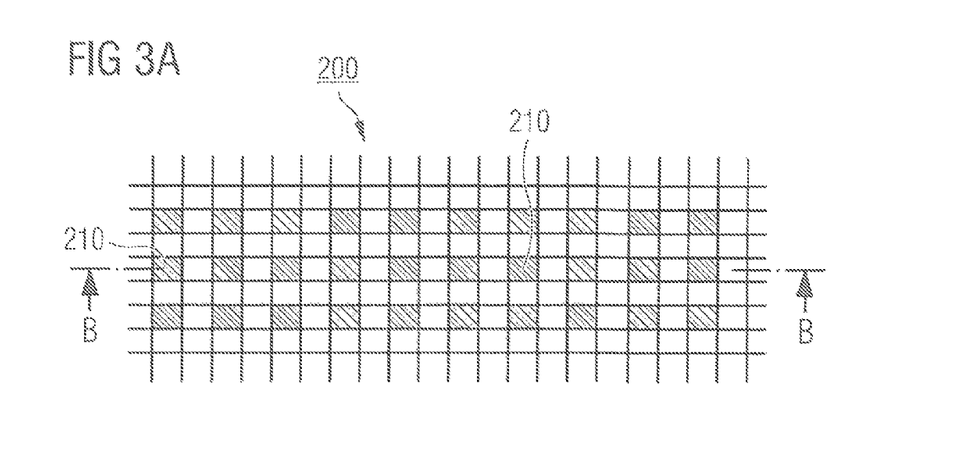
Figure 3B:
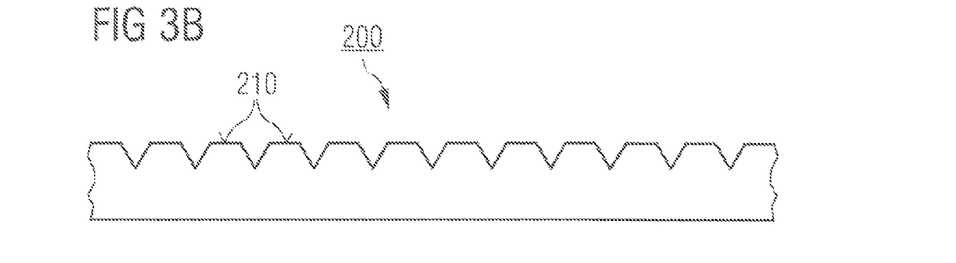

According to an embodiment of the method 10, an electrically conducting holder (chuck) 200 can be provided which comprises a regular pattern of elevations 210. FIGS. 3A and 3B show an example of an electrically conductive holder 200 in a top view (A) and in a cross-sectional side view (B) along line B-B of FIG. 3A. The elevations 210 of the electrically conducting holder 200 of FIGS. 3A and 3B may comprise coplanar flat upper surfaces, which are shown as hatched areas in FIG. 3A, and inclined walls, which are shown as the areas between the hatched areas. When pressing the semiconductor chip onto the electrically conducting holder 200, the metallized back surface of the semiconductor chip will be placed on a number of upper surfaces of elevations 210 so that the contact pressure will be increased as compared to pressing the semiconductor back surface to a flat holder. The structured surface also reduces the influence of unwanted particles. The distance between the adjacent elevations 210 can be in a range from 0.5 mm-1.5 mm and the height of the elevations can be in a range from 0.1 mm to 1 mm. The upper surfaces of the elevations 210 can have rectangular or quadratic form and the side walls can be inclined on all four sides.

The electrically conducting holder 200 may further comprise distance elements like, for example, distance pins which extend from the main face in a direction normal to the plane of the main face and which can be located in edge regions of the holder. The length of the distance elements may determine the distance at which the semiconductor chip panel is positioned related to the electrically conductive holder 200 as explained with respect to block 14 of FIG. 1.

The electrically conducting holder 200 may further comprise openings which extend vertically through the holder up to the main face of the electrically conducting holder 200 and which can be connected to a vacuum pump in order to suck the semiconductor chip panel to the main face of the electrically conducting holder 200.

Figure 4:
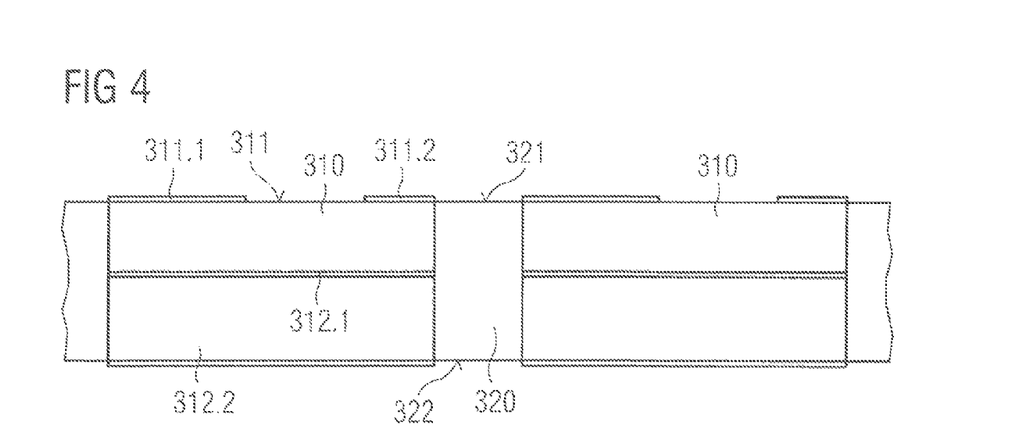
FIG. 4 shows a schematic cross-sectional view of a partial section of a semiconductor chip panel according to an embodiment.

According to an embodiment of the method 10 of FIG. 1, the semiconductor chips or modules are embedded in an encapsulation material in order to form a semiconductor chip panel. FIG. 4 shows a cross-sectional representation of a part of a semiconductor chip panel according to an embodiment. The semiconductor chip panel 300 of FIG. 4 comprises a plurality of semiconductor chips 310 of which only two are shown. The semiconductor chips 310 can be comprised of vertical transistor chips like, for example, IGBT transistor chips. The semiconductor chips 310 may each comprise a first main face 311 and a second main face 312 opposite to the first main face 311. The first main face 311 may have two contact elements 311.1 and 311.2, namely a source contact element 311.1 and a gate contact element 311.2, and the second main face 312 may have a drain contact element 312.1. The drain contact element 312.1 may be connected with a thick conductor element 312.2 which may be made of copper, for example. The semiconductor chips 310 may each have a thickness between the first and second main faces 311 and 312 in a range from 50 μm to 100 μm. The semiconductor chips 310 may be based on Si, SiC, or on a III-V semiconductor material like, for example GaN. The semiconductor chips 310 can be processed in a semiconductor wafer as usual and then diced out of the semiconductor wafer. Thereafter, the singulated semiconductor chips are embedded in an encapsulation material.

Figure 7:
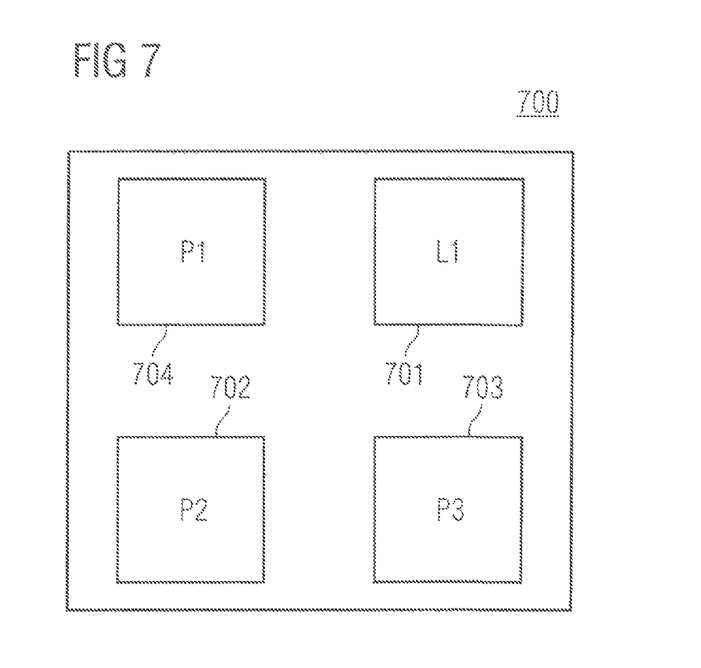
FIG. 7 shows a top view of a semiconductor chip module comprising multiple semiconductor chips according to an example.

The semiconductor chips 310 are embedded within the encapsulation material 320 in such a way that the semiconductor chips 310 are arranged laterally side-by-side so that the first main faces 311 of the semiconductor chips 310 are coplanar with each other and with a first main face 321 of the encapsulation material 320 and the second main faces 312 of the semiconductor chips 310 are coplanar with each other and with a second main face 322 of the encapsulation material 320. The semiconductor chips 310 can be embedded in such a way in the encapsulation material 320 that they are galvanically separated or electrically isolated from each other. Furthermore, the plurality of semiconductor chips 310 may be arranged in a matrix form within the semiconductor chip panel which can be seen in FIG. 7A.

The encapsulation material 320 may comprise one or more of an insulating material, a molding material, a polymer material, a resin material, and an epoxy resin material. The encapsulating material 320 can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO, AlN, or BrN, for example.

According to one embodiment the semiconductor chip panel 300 may comprise a plurality of galvanically separated identical semiconductor chips which are to be tested separately. According to one embodiment the semiconductor chip panel may also comprise a plurality of semiconductor modules in which two or more semiconductor chips are electrically connected with each other to form an electrical circuit. An example thereof will be shown further below.

FIGS. 5A-C, 6A and 6B show different views of an apparatus for testing semiconductor chips in a non-contacting and in a contacting situation. The apparatus 500 for testing semiconductor chips comprises an electrically conductive holder (chuck) 510 which can be configured in the same way as the electrically conducting holder 300 of FIG. 3, and a test contact device 520, which can be configured in the same way as the test contact device 100 as shown and described in FIG. 2. The test contact device 520 can be movably arranged within the apparatus 500 in a direction towards and away the electrically conductive holder 510 as shown by the vertical double arrow.

Figures 5A, 5B, 5C:
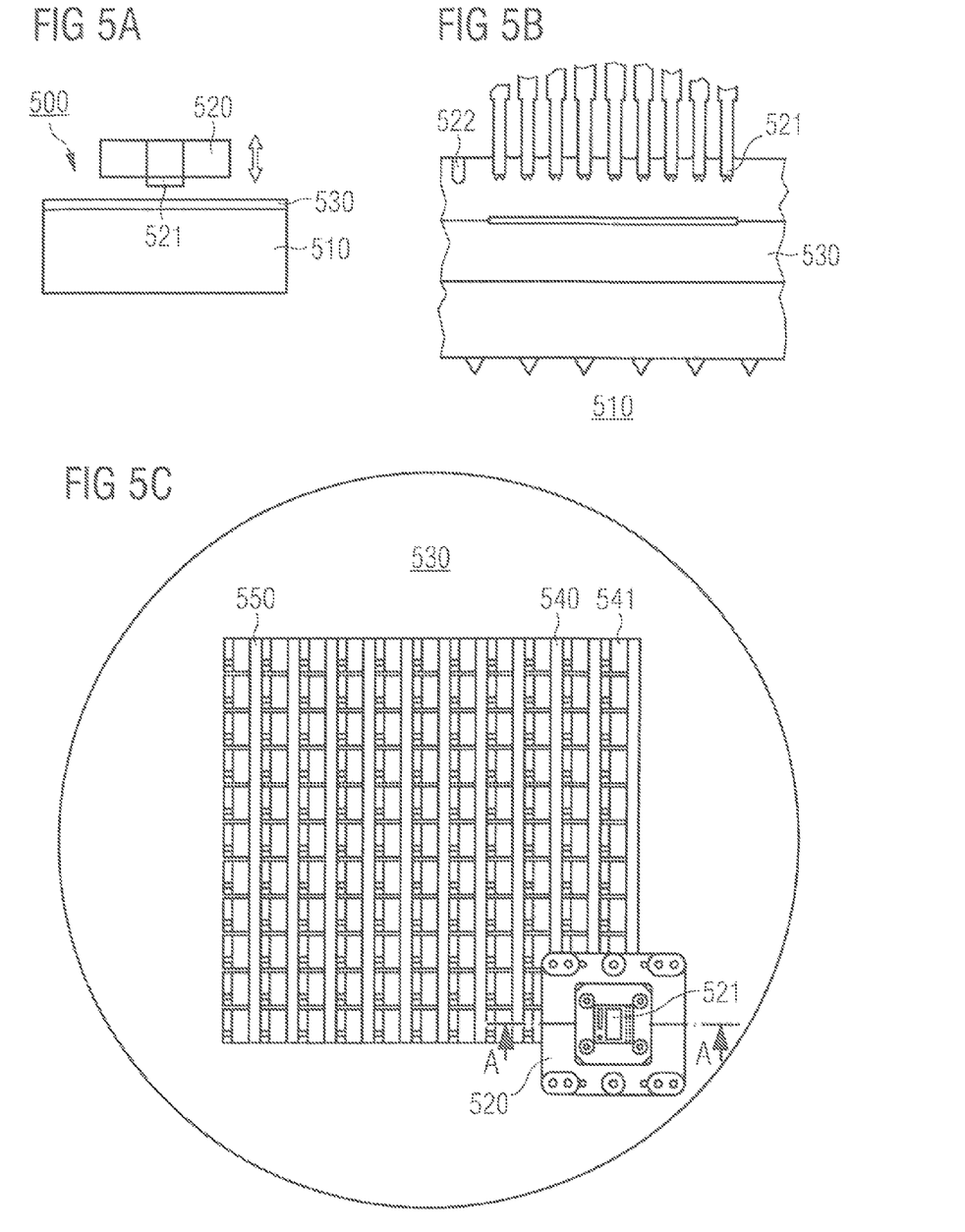

According to an embodiment of the apparatus 500, one or more of the test contact device 520 or the semiconductor chip panel is movable in a horizontal plane parallel to the upper surface of the electrical conductive holder 510. FIG. 5C shows a top view of the test contact device 520 positioned above a semiconductor chip panel 530 which can be configured in the same way as the semiconductor chip panel 300 of FIG. 4. The semiconductor chip panel 530 may comprise an array 540 of individual semiconductor chips 541 embedded within an encapsulation material 550 in such a way that the semiconductor chips 541 are arranged laterally side-by-side in a matrix form and galvanically separated or electrically insulated from each other. The individual semiconductor chips can be comprised of vertical transistor chips as, for example, IGBT transistor chips. Instead of individual semiconductor chips, semiconductor chip modules can also be part of and embedded within a panel and tested in a likewise manner than individual chips.

The test contact device 520 may comprise a plurality of test contact pins 521 which may be arranged in the same way as shown and described in connection with FIG. 2. FIG. 5A shows a cross-sectional view along line A-A depicted in FIG. 5C. The test contact device 520 is shown in a position in which the test contact pins 521 are held above the semiconductor chip to be tested as shown in FIG. 5B, which shows an enlarged cross-sectional view of the center of the test contact device 520. The semiconductor chip panel 530 is situated on the upper surface of the electrically conducting holder 510 and may be fixed to the electrically conducting holder 510 by a suction mechanism due to openings in the electrically conducting holder 510 connected with a vacuum pump (both not shown in the figure). The test contact pins 521 may be comprised of spring-loaded pins. In the situation, as shown in FIGS. 5A-C, the back surface of the semiconductor chip panel 530 is not in contact with the upper surface of the electrically conducting holder 510 but is kept away by a small distance due to distance elements disposed on the upper surface of the electrically conducting holder 510.

Figure 6A:
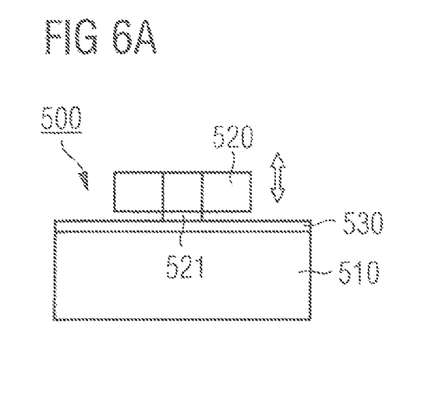
Figure 6B:
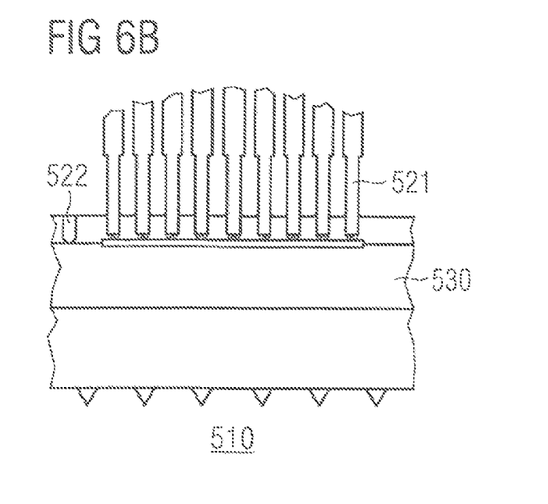

FIGS. 6A and 6B illustrate the process of lowering the test contact device 520 and establishing an electrical contact between the test contact pins 521 and an electrical contact area at the upper surface of the semiconductor chip and, at the same time, pressing the back surface of the semiconductor chip against the upper surface of the electrically conducting holder 510. The test contact device 520 may also comprise distance pins 522.

For lowering the test contact device 520 towards the electrically conducting holder 510, a pressure force is exerted from above to the test contact device 520 until the lower end faces of the distance pins 522 reach the upper surface of the semiconductor chip panel 530. Before this has occurred, the lower end faces of the test contact pins 521 have reached the upper surface of the electrical contact area of the semiconductor chip to be tested and, due to the further downward movement of the test contact device 520, the spring loaded pins 521 are shifted inside the main body of the test contact device 520 against the spring force whilst being in contact with the electrical contact area of the semiconductor chip. At the same time, due to the downward pressure of the test contact pins 521, the semiconductor chip to be tested is pressed downwards until the metallized back surface of the semiconductor chip is contacted with the upper surface of the electrically conducting holder 510. As a result, during one test phase of one semiconductor chip, only the particular semiconductor chip to be tested is contacted by the test contact pins 521 and pressed with its metallized back surface against the upper surface of the electrically conducting holder 510 whilst the rest of the semiconductor chip panel 530 is still separated from the upper surface of the electrically conducting holder 510.

After establishing a satisfactory electrical contact between the test contact pins 521 and the electrical contact area at the upper surface of the semiconductor chip and between the metallized back surface of the semiconductor chip and the upper surface of the electrically conducting holder 510, the electrical measurement can be performed. The measurement can be done, for example, by applying a voltage to a gate contact area by other test contact pins not shown in the figures, and measuring an electrical current flowing through the test contact pins 521 and the source contact area through the vertical transistor to the backside drain contact area and from there into the electrically conducting holder 510.

Thereafter, the test contact device 520 can be lifted up again and one or more of the test contact device 520 and the semiconductor chip panel 530 can be shifted laterally to a next semiconductor chip to be tested by repeating the procedure as described above. After having tested all semiconductor chips of the semiconductor chip panel 530, the semiconductor chip panel 530 can be singulated and the good semiconductor chips can, for example, be built within power modules by connecting them in parallel.

FIG. 7 shows a top view of a semiconductor chip module according to an example. The semiconductor chip module 700 of FIG. 7 can be a so-called intelligent power module (IPM). It may include three power transistors 704 (P1), 702 (P2), and 703 (P3) and a logic circuit 701 (L1). The logic circuit 701 may be configured to control and drive the power transistors. It may also include further functions like, for example, a temperature sensor function. A plurality of such semiconductor chip modules can be embedded in a matrix form in an encapsulation material and thus form a semiconductor chip panel such as that shown in FIG. 5C. Each one of the semiconductor chip modules can be tested as a whole or the individual chips of each one of the semiconductor chip modules can be tested.

Figure 8:
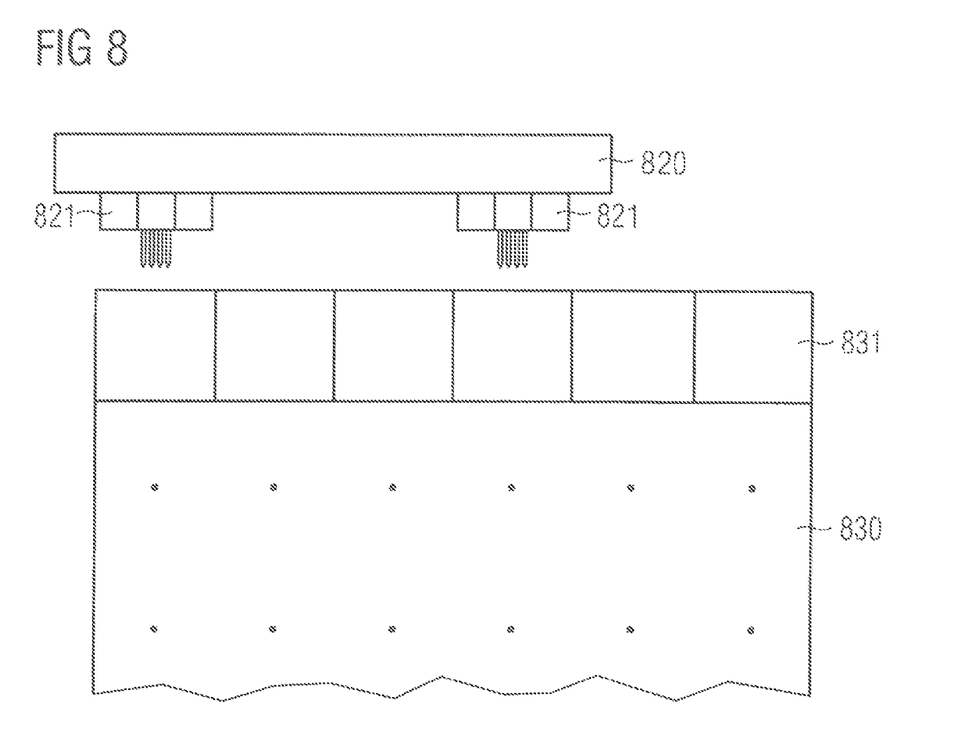
FIG. 8 shows a top view of a semiconductor chip panel comprising a matrix arrangement of semiconductor chip modules or individual semiconductor chips for illustrating simultaneous testing of several modules or chips according to an example.

FIG. 8 shows a top view of a part of a semiconductor chip panel 830 comprising a matrix arrangement of semiconductor chip modules 831 or individual semiconductor chips for illustrating simultaneous testing of several modules or chips according to an example. For simultaneous testing two or more chips or modules, a test contact device 820 can be employed which includes two or more test contact elements 821 which can be simultaneously moved downward so that two or more chips or modules can be contacted at once and tested at the same time. The test contact elements 821 can have a distance from each other which is greater than the distance between two adjacent chips or modules in the matrix.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for testing semiconductor chips, the method comprising:
   providing a semiconductor chip panel comprising a plurality of semiconductor chips embedded in an encapsulation material so that the encapsulation material is provided only between side faces of neighboring semiconductor chips, wherein at least one of the semiconductor chips comprises a first electrical contact element on a first main face and a second electrical contact element on a second main face opposite to the first main face, respectively; and
   testing the at least one of the semiconductor chips by establishing an electrical contact between a test contact device and the first electrical contact element and between an electrically conductive holder and the second electrical contact element, wherein testing the semiconductor chips comprises:

positioning the semiconductor chip panel in a distance to the electrically conductive holder so that the test contact device is positioned above a particular semiconductor chip or panel to be tested;

establishing an electrical contact between the test contact device and a first contact element of one semiconductor chip of the plurality of semiconductor chips by moving the test contact device downwards in a direction of the semiconductor chip to be tested until test pins of the test contact device come into contact with the first contact element on the first main face of the semiconductor chip; and establishing an electrical contact between a second contact element of the semiconductor chip and the electrically conductive holder by exerting a downward force on the test contact device and thereby pressing the semiconductor chip downward onto the electrically conductive holder.

2. The method according to claim 1, wherein the at least one of the semiconductor chips comprises a power transistor, a vertical transistor, a MOS transistor, an insulated gate bipolar transistor, a logic circuit, or a passive component.

3. The method according to claim 1, wherein the semiconductor chips comprise equal electrical devices.

4. The method according to claim 1, wherein the semiconductor chips comprise different electrical devices.

5. The method according to claim 1, wherein the semiconductor chips are arranged in a matrix form.

6. The method according to claim 1, wherein the semiconductor chip panel comprises a semiconductor chip module, the semiconductor chip module comprising two or more semiconductor chips.

7. The method according to claim 6, wherein the semiconductor chip module comprises an intelligent power module.

8. The method according to claim 1, wherein the semiconductor chip panel comprises a plurality of semiconductor chip modules arranged in a matrix form.

9. The method according to claim 1, wherein the at least one of the semiconductor chips comprises a thickness in a range from 30 µm-150 µm.

10. The method according to claim 1, wherein the electrically conductive holder comprises distance elements connected thereto, and wherein testing the at least one of the semiconductor chips comprises positioning the semiconductor chip panel at a distance to the electrically conductive holder by placing the semiconductor chip panel on the distance elements.

11. The method according to claim 1, further comprising:
moving the test contact device relative to the electrically conductive holder so that the test contact device is positioned above the at least one of the semiconductor chips and thereafter testing the at least one of the semiconductor chips; and thereafter
moving the test contact device relative to the electrically conductive holder to successively test other semiconductor chips.

12. The method according to claim 1, wherein testing the at least one of the semiconductor chips comprises applying one or more voltages to at least one of the test contact device and the electrically conducting holder, and measuring one or more of a current, a conductivity or a resistivity.

* * * * *